(12) United States Patent
Breed et al.

(10) Patent No.: US 9,103,869 B2
(45) Date of Patent: Aug. 11, 2015

(54) CABLE DIAGNOSTICS FOR BASE-T SYSTEMS

(71) Applicant: MARVELL INTERNATIONAL LTD., Hamilton (BM)

(72) Inventors: Divya Srinivasan Breed, Laguna Niguel, CA (US); Brett A. McClellan, Laguna Hills, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 13/914,215

(22) Filed: Jun. 10, 2013

(65) Prior Publication Data

US 2013/0271151 A1 Oct. 17, 2013

Related U.S. Application Data

(62) Division of application No. 12/653,273, filed on Dec. 9, 2009, now Pat. No. 8,461,848.

(60) Provisional application No. 61/201,519, filed on Dec. 10, 2008.

(51) Int. Cl.
*G01R 31/11* (2006.01)
*G01R 31/02* (2006.01)

(52) U.S. Cl.
CPC .............. *G01R 31/11* (2013.01); *G01R 31/021* (2013.01)

(58) Field of Classification Search
CPC .... G01R 31/11; G01R 31/021; G01R 31/024; H04L 12/2697; H04L 43/50; H04B 3/46; H01R 2201/20
USPC .................. 324/533, 534, 538, 539
See application file for complete search history.

(56) References Cited

U.S. PATENT DOCUMENTS

| | | | |
|---|---|---|---|
| 3,916,095 A | 10/1975 | Weber et al. |
| 4,583,235 A | 4/1986 | Domer et al. |
| 4,719,643 A | 1/1988 | Beeman |
| 4,947,425 A | 8/1990 | Grizmala et al. |
| 5,301,193 A | 4/1994 | Toyofuku et al. |
| RE35,607 E | 9/1997 | Nagamune et al. |
| 5,699,402 A | 12/1997 | Bauer et al. |
| 5,778,191 A | 7/1998 | Levine et al. |
| 5,822,371 A | 10/1998 | Goldstein et al. |
| 5,862,179 A | 1/1999 | Goldstein et al. |

(Continued)

FOREIGN PATENT DOCUMENTS

| | | |
|---|---|---|
| GB | 2303 754 A | 2/1997 |
| KR | 10-0263410 B1 | 8/2000 |
| KR | 10-2006-0017222 | 2/2006 |

OTHER PUBLICATIONS

George Zimmerman, Deep Sleep Idle Concept for PHYs', IEEE P802.3az Energy Efficient Ethernet Task Force, Atlanta, GA, USA, Nov. 11, 2007, slides 3-13.

(Continued)

*Primary Examiner* — Amy He

(57) ABSTRACT

A method includes generating a pulse, transmitting the pulse on a first cable of a multi-cable communication system, monitoring a second cable of the multi-cable communication system for the pulse or a reflection of the pulse on the second cable, and, if the monitoring detects the pulse or the reflection on the second cable, outputting a notification of a short between the first cable and the second cable.

17 Claims, 10 Drawing Sheets

(56) References Cited

U.S. PATENT DOCUMENTS

| | | | |
|---|---|---|---|
| 6,009,126 | A | 12/1999 | Van Bezooijen |
| 6,032,197 | A | 2/2000 | Birdwell et al. |
| 6,075,628 | A | 6/2000 | Fisher et al. |
| 6,088,345 | A | 7/2000 | Sakoda et al. |
| 6,201,831 | B1 | 3/2001 | Agazzi et al. |
| 6,212,398 | B1 | 4/2001 | Roberts et al. |
| 6,226,332 | B1 | 5/2001 | Agazzi et al. |
| 6,249,544 | B1 | 6/2001 | Azazzi et al. |
| 6,252,904 | B1 | 6/2001 | Agazzi et al. |
| 6,253,345 | B1 | 6/2001 | Agazzi et al. |
| 6,650,638 | B1 | 11/2003 | Walker et al. |
| 6,823,483 | B1 | 11/2004 | Creigh |
| 6,885,679 | B1 | 4/2005 | Cheong et al. |
| 6,934,655 | B2 | 8/2005 | Jones et al. |
| 6,947,483 | B2 | 9/2005 | Engwer |
| 6,956,847 | B2 | 10/2005 | Heston et al. |
| 7,088,398 | B1 | 8/2006 | Wolf et al. |
| 7,106,071 | B2 | 9/2006 | Pharn et al. |
| 7,127,653 | B1 | 10/2006 | Gorshe |
| 7,245,129 | B2 | 7/2007 | Wajcer et al. |
| 7,403,018 | B1 * | 7/2008 | Lo et al. ........................ 324/533 |
| 7,724,692 | B1 | 5/2010 | Fang et al. |
| 2002/0067824 | A1 | 6/2002 | Wang |
| 2002/0129307 | A1 | 9/2002 | Walker et al. |
| 2002/0161542 | A1 * | 10/2002 | Jones et al. ................... 702/108 |
| 2003/0020803 | A1 | 1/2003 | Yang et al. |
| 2003/0095054 | A1 | 5/2003 | Ichino |
| 2003/0108092 | A1 | 6/2003 | Gorecki et al. |
| 2003/0206564 | A1 | 11/2003 | Mills et al. |
| 2004/0228364 | A1 | 11/2004 | Walker et al. |
| 2005/0105545 | A1 | 5/2005 | Thousand et al. |
| 2005/0157811 | A1 | 7/2005 | Bjerke et al. |
| 2007/0067497 | A1 | 3/2007 | Craft et al. |
| 2007/0101241 | A1 | 5/2007 | Hoyer |
| 2007/0242670 | A1 | 10/2007 | Simonson et al. |

OTHER PUBLICATIONS

Oscar Agazzi, et al., "10Gb/s PMD Using PAM-5 Trellis Coded Modulation", Broadcom, *IEEE* 802.3, Albuquerque, New Mexico, Mar. 6-10, 2000, 38 pages.

Jamie E. Kardontchik, "4D Encoding in Level-One's Proposal for 1000BASE-T", Advanced Micro Devices, Aug. 21, 1997—Rev. B, pp. 1-24.

Erich F. Haratsch, et al., "A 1-Gb/s Joint Equalizer and Trellis Decoder for 1000BASE-T Gigabit Ethernet", *IEEE Journal of Solid-State Circuits*, vol. 36, No. 3, Mar. 2001, pp. 374-384.

Mehdi Hatamian, et al., "Design Considerations for Gigabit Ethernet 1000Base-T Twisted Pair Transceivers", IEEE 1998 Custom Integrated Circuits Conference, pp. 335-342.

Gottfried Ungerboeck, "Trellis-Coded Modulation with Redundant Signal Sets", *IEEE Communications Magazine*, Feb. 1987, vol. 25, No. 2, pp. 5-21.

"Gigabit Ethernet Over Category 5", Copyright 2000-2001 Agilent Technologies, 12 pages.

M.P. Sellers, et al., "Stabilized Precoder for Indoor Radio Communications", *IEEE Communications Letters*, vol. 4, No. 10, Oct. 2000, pp. 315-317.

"Wirescope 350—Understanding ELFEXT", © 2000 Agilent Technologies, 2 pages.

David Crawford, "Adaptive Filters", © David Crawford 1996, pp. 1-5.

David A. Johns et al., "Integrated Circuits for Data Transmission Over Twisted-Pair Channels", *IEEE Journal of Solid-State Circuits*, vol. 32, No. 3, Mar. 1997, pp. 398-406.

Prof. David Johns, University of Toronto, "Equalization", © D.A. Johns 1997, 29 pages.

Richard D. Wesel, et al. "Achievable Rates for Tomlinson-Harashima Precoding", *IEEE Transactions on Information Theory*, vol. 44, No. 2, Mar. 1998, pp. 824-831.

Wolfgang H. Gerstacker, et al., "Blind Equalization Techniques for xDSL Using Channel Coding and Precoding", submitted to AEU Int. J. Electr. Commun., May 1999, pp. 1-4.

Chip Fleming, "A Tutorial on Convolutional Coding with Viterbi Decoding", © 1999-2002, Spectrum Applications, pp. 1-6.

David Smalley, "Equalization Concepts: A Tutorial", Atlanta Regional Technology Center Texas Instruments, Oct. 1994, pp. 1-29.

Shao-Po Wu, et al., "FIR Filter Design via Spectral Factorization and Convex Optimization", to appear as Chapter I of *Applied Computational Control, Signal and Communications*, Biswa Datta Editor, Birkhausesr, 1977, pp. 1-33.

"28.5 Protocol Implementation Conformance Statement (PICS) Proforma for Clause 28, Physical Layer Link Signaling for 10 Mb/s, 100 Mb/s and 1000 Mb/s Auto-Negotiation on Twisted Pair", *IEEE Std.* 802.3, 1998 Edition, pp. 6-14 and 18-44.

M. Tomlinson, "New Automatic Equalizer Employing Modulo Arithmetic", *Electronic Letters*, vol. 7, 1971, pp. 138-139.

H. Harashima and M. Miyakawa, "Matched-Transmission Technique for Channels with Intersymbol Interference", *IEEE Transactions on Communications*, vol. COM-20, No. 4, Aug. 1972, pp. 774-780.

P. Kabal and S. Pasupathy, "Partial-Response Signaling", *IEEE Transactions on Communications*, vol. COM-23, No. 9, Sep. 1975, pp. 921-934.

R.F.H. Fischer, W.H. Gerstacker, and J.B. Huber, "Dynamics Limited Precoding, Shaping, and Blind Equalization for Fast Digital Transmission Over Twisted Pair Lines", *IEEE Journal on Selected Areas in Communications*, vol. 13, No. 9, Dec. 1995, pp. 1622-1633.

R.F.H. Fischer and J.B. Huber, "Comparison of Precoding Schemes for Digital Subscriber Lines", *IEEE Transactions on Communications*, vol. 45, No. 3, Mar. 1997, pp. 334-343.

Li, M.; Wang, S., T. Tao, T. Kawasniewski, "FIR Filter Optimization as Pre-emphasis of High Speed Backplane Data Transmission", *Electronics Letters*, Jul. 8, 2004, vol. 40, No. 14, 2 pages.

"Producing a Counter EMF" http://www.tpub.com/neets/book2/5e.htm 3 pages. (date unknown).

A. Herkersdorf, et al., "A Scalable SDH/SONET Framer Architecture for DATACOM and TELCO Applications", IBM Research, Zurich Research Laboratory, Switzerland, 8 pages. (date unknown).

Christopher T. DiMinico of Cable Design Technologies (CDT) Corporation, Massachusetts and Paul Kish of *NORDX/CDT*, Montreal, Canada, "Development of Equal Level Far-End Crosstalk (ELFEXT) and Return Loss Specifications for Gigabit Ethernet Operation on Category 5 Copper Cabling", 10 pages. (date unknown).

Pedro Silva, et al., "Precoder Circuit for Channels with Multipath Dispersion", Telecommunications Institute, Department of Electronics and Telecommunications Engineering, The University of Aveiro—University Campus, Portugal, 4 pages (date unknown).

Shao-Po Wu, et al., "FIR Filter Design via Semidefinite Programming and Spectral Factorization", Information Systems Laboratory, Stanford University, CA, 6 pages (date unknown).

J. Jezek, Institute of Information Theory and Automation, Prague, Czec Republic, et al., "New Algorithm for Spectral Factorization and its Practical Application", pp. 1-6 (date unknown).

"ADSL Tutorial", http://www.dslforum.org/aboutdsl/ads 1 tutorial.html, pp. 1-3 (date unknown).

"Introduction to DSP" http://www.bores.com/courses/intro/filters/4 fir.htm pp. 1-2 (date unknowril.

"QAM VR-QAM Demodulator with Variable Rate", DesignObjects™ by sci-worx, pp. 1-2 (date unknown).

Description of Algorithms (Part I) http://pwl.netcom.com/Ichip.f/viterbi/algrthms.html pp. 1-7 (date unknown).

"Continuous Time Aperiodic Signals: The Fourier Transform", http://ece.ucsd.edu/Icruz/ece.101/notes/nodes32.html, pp. 1-2 (date unknown).

"Convolution", http://www.wam.umd.edu/Itoh/spectrurm/Convolution.html, pp. 1-2 (date unknown).

"Convolution by DFT", http://www.gresilog.com/english/excommend/doc/convtd.htm, pp. 1-3 (date unknown).

Eyuboglu M V., "Flexible Precoding for V. Fast", Data Transmission-Advances in modem and ISDN Technology and Applications, 1992, UK, IEE, UK 1992, pp. 13-18.

* cited by examiner

CABLE DIAGNOSTICS FOR BASE-T SYSTEMS

PRIORITY CLAIM

This application is a divisional application of U.S. patent application Ser. No. 12/653,273, entitled "Cable Diagnostics for Base-T Systems," filed on Dec. 9, 2009, now U.S. Pat. No. 8,461,848, which claims the benefit of U.S. Provisional Patent Application Ser. No. 61/201,519 filed on Dec. 10, 2008 and entitled "Cable Diagnostics for Base-T Systems." The disclosures of both of the above-referenced applications are hereby incorporated herein by reference.

FIELD OF THE INVENTION

This invention relates to cable diagnostics and in particular to a method and apparatus for cable diagnostics in a Base-T system.

RELATED ART

Cable diagnostics for Base-T systems are useful for estimating cable length and identifying cable faults. Prior solutions for single-ended cable diagnostics use the method of time domain reflectometry (TDR), where a pulse of finite duration is transmitted and the reflected pulse (also known as the echo of the transmit pulse) is captured to analyze the cable, but the prior art system utilizes pulses which may be confused with other channel noise or signals. In addition, the prior art TDR operation occurs when the channel is disabled or when it is not yet in service. In addition, the prior art does not use an IEEE 802.3 standard compliant transmit pulse. If an active, standard compliant PHY is connected at the far end, a non-compliant pulse will cause errors on that PHY.

In one prior art case disclosed in U.S. Pat. No. 7,245,129, the shape of the transmit pulse is optimized for the channel characteristics of the cable in order to maximize the signal to noise ratio of the reflected pulse. The reflected amplitude is analyzed for positive and negative peaks, and the relative locations of these are used to characterize the cable.

In another case disclosed in U.S. Pat. No. 6,934,655, the transmit signal is chosen for good auto-correlation properties so that the timing and amplitude of its reflection can be easily determined. These properties are used to characterize the cable under test. Alternatively, in this method, an echo cancellation filter can be adapted to the reflected signal, and the echo canceller coefficients can be analyzed to characterize the cable.

SUMMARY

Cable diagnostics for Base-T systems are useful for estimating cable length and identifying cable faults. Diagnostics can be deployed as part of an Ethernet PHY to allow diagnostics to be conducted in the field. As an interoperable PHY, the near end should be able to conduct its diagnostics with any IEEE 802.3 standard compliant vendor as the far end PHY. The diagnostics signal may be standard compliant.

For a single-ended system to measure cable length, the best results typically come from TDR (Time Domain Reflectometry). Disclosed herein is a technique of transmitting a pulse of finite duration and measuring the amplitude and round-trip delay of the pulse's reflection, also known as its echo. In one embodiment, this innovation uses an IEEE 802.3 compliant transmit pulse, such as an auto-negotiation signal (AN pulse), to conduct cable diagnostics.

The benefits of a standard compliant pulse are two-fold. First, the signal can be used with any vendor on the far-end without causing errors. Second, the signal requires no special hardware or software to produce and, therefore, reduces system complexity and cost.

If there is another standard compliant PHY at the far-end, it will attempt to auto-negotiate with the near-end PHY via its own AN pulse(s). These pulses can resemble the echo pulses and can therefore cause incorrect length and termination measurements.

To mitigate the likelihood of incorrect measurements, this invention measures the cable length and termination with multiple AN pulses. It then applies non-linear filters to these redundant measurements in such a way that it produces accurate cable diagnostics information even in the presence of a far-end signal, as long as the behavior of the far-end PHY is also IEEE 802.3 compliant.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

DETAILED DESCRIPTION

Figure 1:
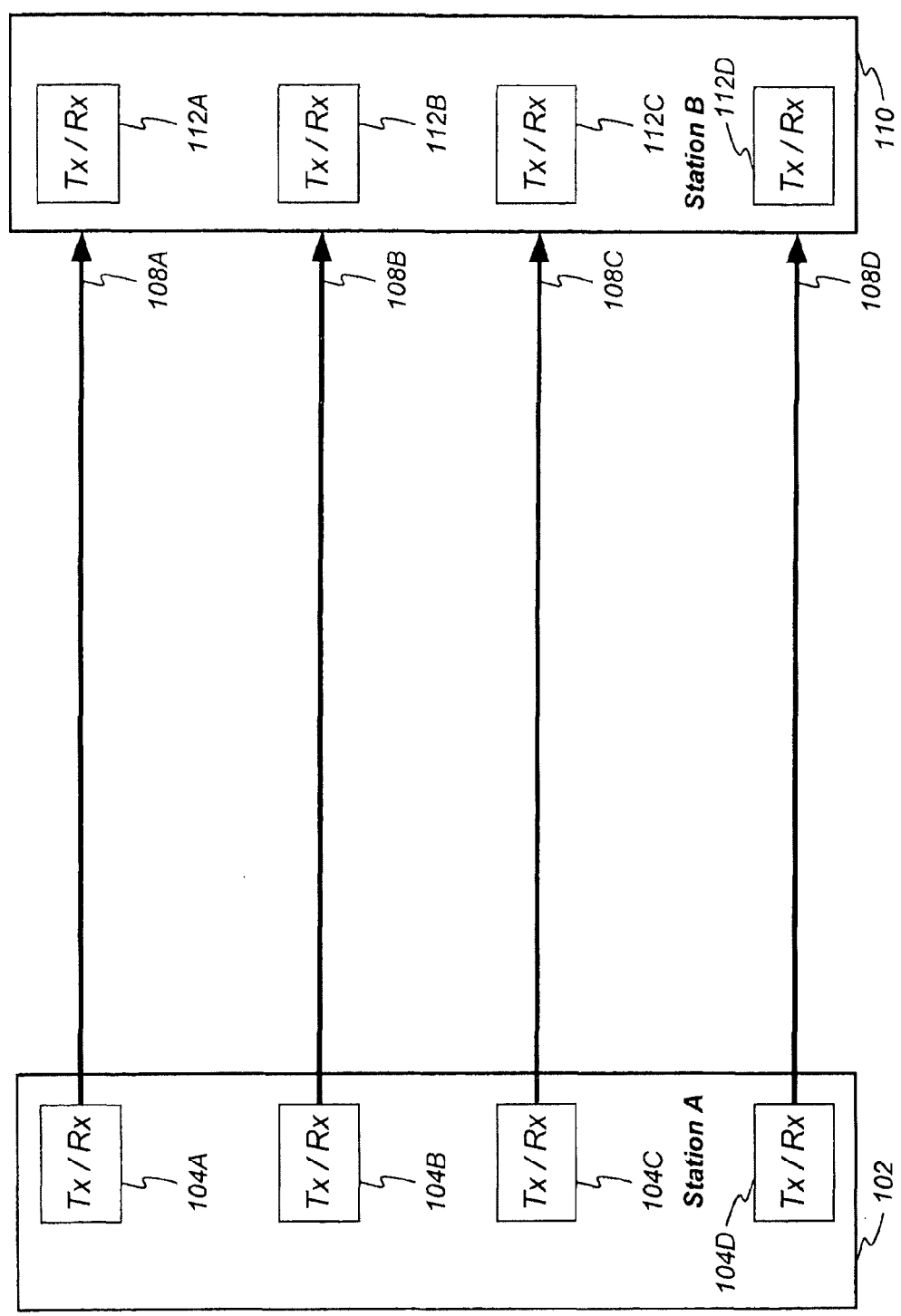
FIG. 1 illustrates a block diagram of an example embodiment of a two station communication system.

FIG. 1 illustrates a block diagram of an example embodiment of a two station communication system. As shown a first set of transceivers 104A-104D is part of Station A 102, which is located at a first location. Station A 102 communicates over channels 108A-108D with a second set of transceivers 112A-112D that are part of Station B 110 and which are located at a second location. One exemplary communication system that adopts such a configuration is a network Ethernet communication system. Those of ordinary skill in the art understand communication systems of this nature and as a result an extensive discussion is not provided herein.

Figure 2:
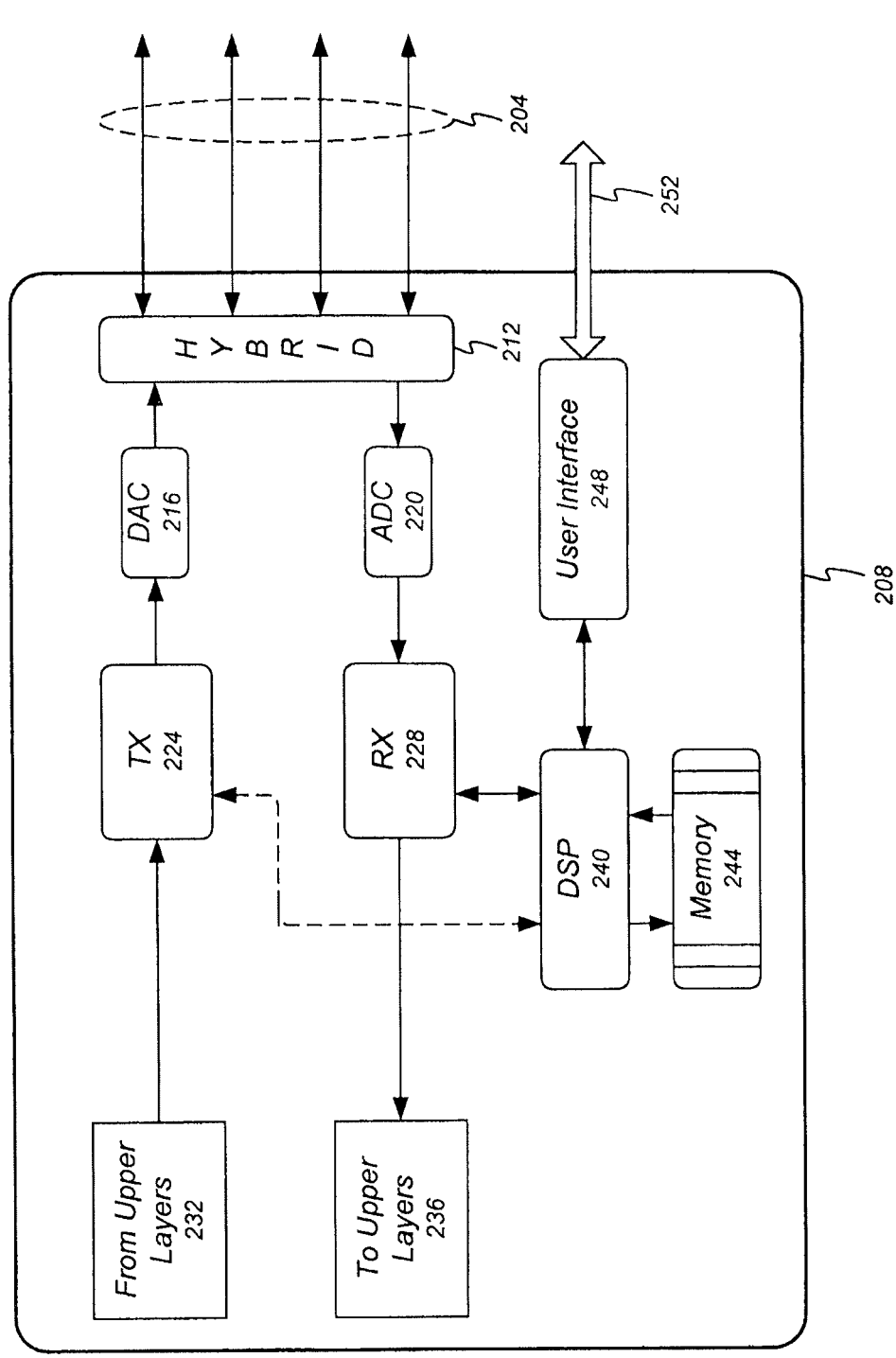
FIG. 2 illustrates a block diagram of an example embodiment of a communication system configured with channel analysis capability.

FIG. 2 illustrates a block diagram of an example embodiment of a communication system configured with channel analysis capability. This is but one possible embodiment of hardware and as such it is contemplated that one of ordinary skill in the art may generate different embodiment that do not depart from the claims that follow. As shown and discussed below, the systems of FIG. 2 may comprise hardware, software or a combination of software and hardware.

As shown, one or more communication channels 204 connect to a communication device 208. The channels 204 may comprise any type channel but in this example embodiment the channels comprise twisted pair copper, such as CAT5 or variations of this type channel. The communication 208 device may comprise any type communication device, but in this example embodiment the communication device 208 comprises an Ethernet communication device. The device may be configured as a communication card within a computer or on a motherboard or network board or other network device, or as part of a switch, router, hub, server or any other such network communication device.

The channels 204 connect to a hybrid 212 which separates incoming and outgoing signals as is understood in the art. The hybrid isolates and sends incoming signals to an analog to digital converter ADC 220. The output of the ADC 220 connects to a receiver 228. The output of the receiver 228 provides the received and processed signal to upper layers 236 or other components of the communication device for use by a user or other processing elements.

Likewise, outgoing signals from upper layers 232 or other processing elements are presented to the transmitter 224. The transmitter 224 executes standard processing on the input to generate an output suitable for transmission over the one or more channels 204. The DAC 216 converts the digital output from the transmitter to an analog format and a driver (not shown) may be present to amplify the outgoing signals to the proper power level for transmission over the channels 204.

A digital signal processor (DSP) 240 connects to or interfaces with the receiver 228. The DSP 240 may also interface with the transmitter to coordinate operation of the system as described herein. Although shown as a DSP 240, the DSP may comprise any processing element including a processor, ASIC, FPGA, DSP, control logic, or other such device. Memory 244 connects to and is accessible by the DSP 240. The memory 244 may comprise any type read/write memory suitable for storing data and machine readable code. The machine readable code stored on the memory 244 may be configured to perform the routings and data processing disclosed herein.

A user interface 248 connects to the DSP 240 to facilitate user interface to the DSP and the data and processing results stored in memory. The user interface 248 may comprise any type interface including but not limited to a computer bus, USB port, serial port, firewire, Ethernet connection, or another presently existing or future developed interface. In operation, the system of FIG. 2 performs the processing operation described herein and discussed below.

In one embodiment of this method and apparatus, an IEEE 802.3 compliant auto-negotiation (AN) pulse is transmitted on a 4-pair UTP Ethernet cable. A buffer is used to capture the received signal samples from the time of the transmitted pulse to a predetermined time period, such as 5 microseconds, after the transmission. In one embodiment the AN pulse comprises a square pulse of 100 nanosecond duration. The received reflection signal is used to identify the near-end and far-end reflections of the AN pulse which are caused, respectively, by the cable connector at the near-end PHY and the termination at the far end of the cable. The far end of the cable may be connected to another PHY, or it maybe left disconnected. In case of a cable fault, such as a shorted wire or a broken (or "open") wire, the far end echo will be a reflection of the pulse from the location of the fault.

In one embodiment, the near-end echo is identified by applying an amplitude threshold proportional to the noise level of the signal. To identify the far end echo, the receive signal is first filtered to improve the signal to noise ratio, and then another amplitude threshold is applied. The number of samples between the near-end and far-end reflections may be proportional to the length of the cable or the distance to the nearest cable fault. The amplitude of the far-end echo may determine the termination and/or fault type.

In one embodiment, this method may have a period of silence before any measurement is taken to ensure that a standard compliant far-end PHY will not transmit anything other than an auto-negotiation (AN) signal during the cable diagnostics measurements. If there is such a device on the far-end, it may be transmitting auto-negotiation pulses while attempting to establish a link. In order to avoid false detection of the far-end reflection due to the presence of these pulses in the received signal, the measurement process may be repeated multiple times at close intervals. Since the AN pulses may be configured to have a specific duration of silence (specific to a communication standard) in between each pulse, repeating the test multiple times with a much shorter interval between pulses ensures that, statistically, the majority of measurements will be taken on actual echo pulses. The measured lengths are median filtered, or other type filtering or analysis, to eliminate possible interference from far-end AN pulses. The termination type, i.e. the presence of a far-end PHY versus a cable fault, is determined by a majority rule across the multiple trials.

The one or more embodiments of the method and apparatus described herein has numerous advantages over the prior art. These one or more advantages include but are not limited to:
- uses an IEEE 802.3 compliant transmit signal for cable diagnostics;
- will work with any IEEE 802.3 compliant device on the far end;
- no special hardware, software, or extra power is required;
- uses redundancy and non-linear filtering to reduce the likelihood of erroneous results; and
- does not require far-end silence or special, termination device.

The following describes exemplary methods and apparatus of the innovation.

Auto-Negotiation TDR Method

An auto negotiation method is disclosed which captures the time-domain reflection of Auto-Negotiation (AN) pulses by using an internal buffer. It then identifies the near and far end echoes and uses the distance between the signal echoes to estimate the cable length. It also uses the amplitudes of the far end echoes to determine whether the cable is terminated to a far-end PHY, or if it has an open or shorted wire.

The presence of actual AN pulses from a far end device can cause incorrect measurements due to the resemblance between these pulses and the reflected pulses from the device conducting the test. In order to avoid this, each measurement is repeated multiple times and the results are calculated and saved for one or more or all iterations. Using all of the stored measurements, the cable length may be chosen by median filter to avoid spurious results. An improper termination is determined by whether a majority of the results were flagged for that type of cable fault.

Cable Length—PHY Terminated, Open Wire or Shorted Wire

In one embodiment, the method disclosed herein calculates the length of the cable under test for good cables which are terminated by another PHY. For faulty cables with an open wire or a wire short between the two wires of any pair, this method calculates the distance to the location of the cable fault.

Figure 3:
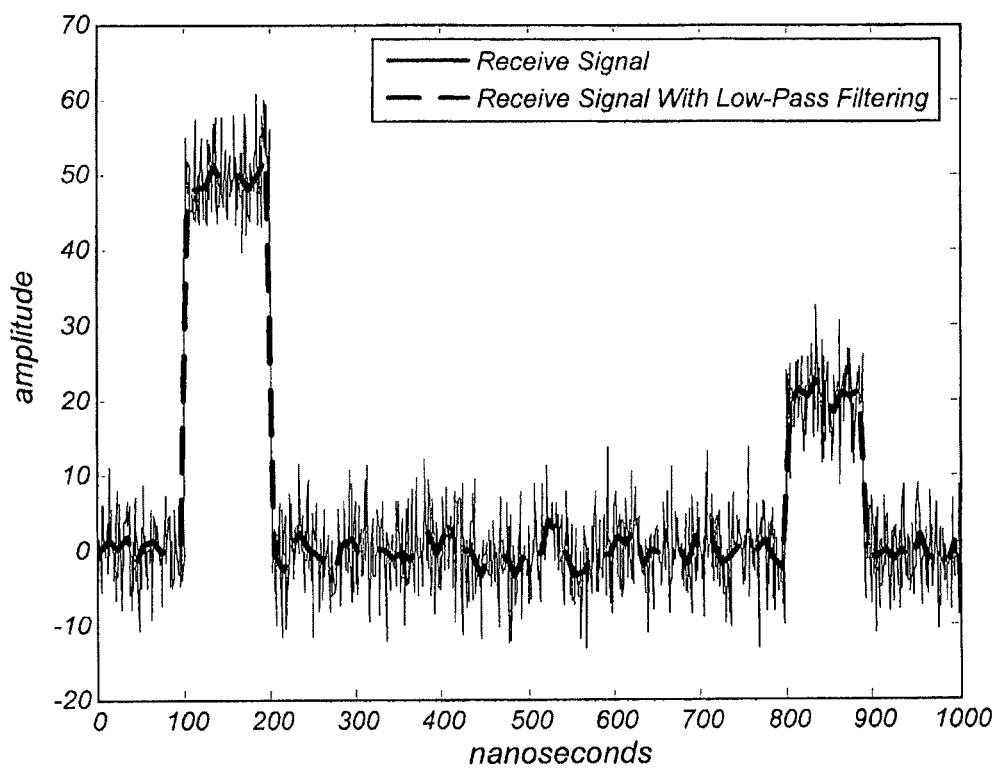
FIG. 3 illustrates an exemplary plot of raw and low pass filtered echo.

For one or more length estimates, an AN pulse reflection is captured by an analog-to-digital converter which is connected to the cable under test, and the resulting digital samples are stored in digital memory. To improve the signal-to-noise ratio of the data, the DC component may be removed and a low-pass filter may be applied to the data. FIG. 3 illustrates an exemplary plot of raw and filtered data.

Figure 4:
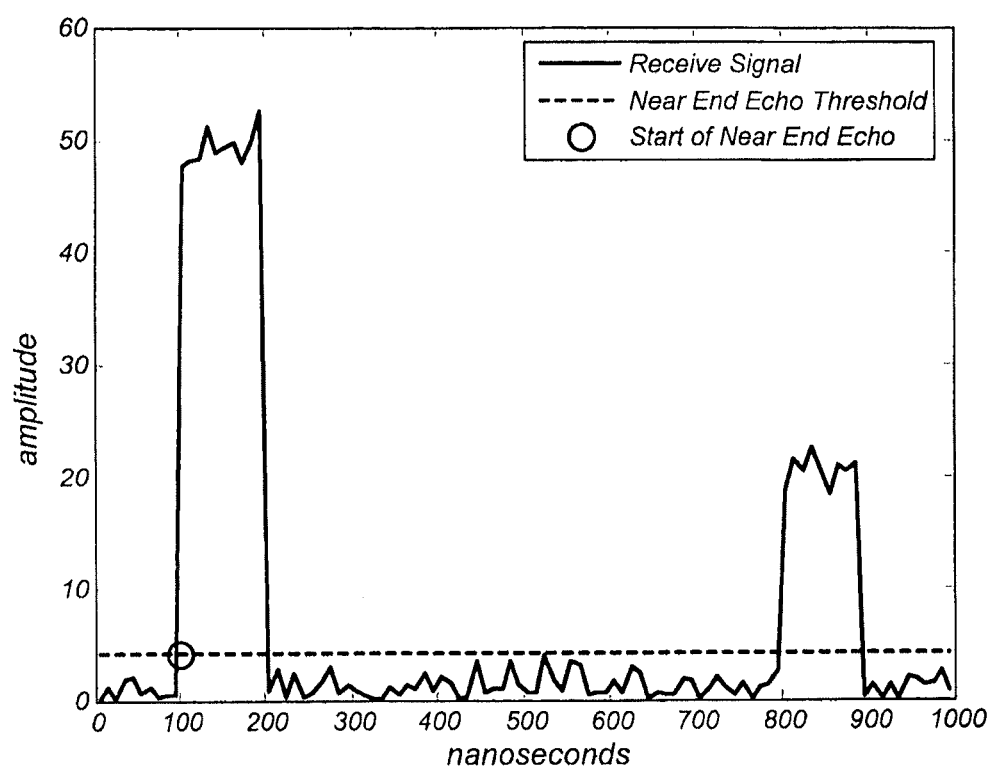
FIG. 4 illustrates an exemplary plot of magnitude of echo with near end limiting.

In the embodiment disclosed herein the near end echo location is determined by a threshold. The threshold may be set as double the maximum absolute value of the first portion of the vector, i.e., the peak noise value. In other embodiments other threshold values may be established. FIG. 4 illustrates an exemplary plot of magnitude of echo with near end limiting. The start of the near end echo is identified by the circle at 100 nanoseconds.

The far end echo location can be a little more difficult to identify because of attenuation as the pulse travels along the cable. The signal-to-noise ratio for this echo can be enhanced by applying a high-pass filter. The simplest such filter that suffices for accuracy is a one-point differential although in other embodiments other filters may be utilized.

Figure 5:
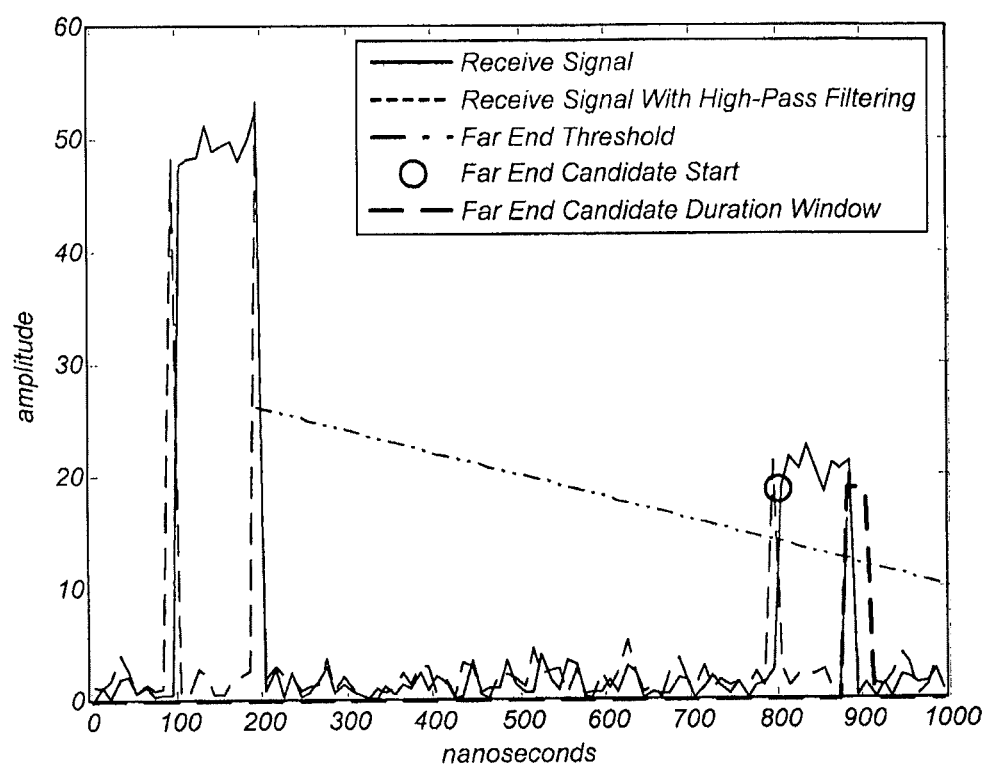
FIG. 5 illustrates an exemplary plot of magnitude of echo after high pass filtering and a plot of far end threshold with the duration requirement.

In this embodiment the far end echo is identified by searching the high-pass filtered signal backwards for two values which exceed a threshold and are a fixed distance apart. The distance between the two values can approximate the duration of the auto-neg pulse. FIG. 5 illustrates an exemplary plot of magnitude of echo after high pass filtering and a plot of far end threshold with the duration requirement. The various plots are identified by the key shown in the upper right hand corner of the plot.

Cable Length—Inter-Pair Wire Short

Figure 6:
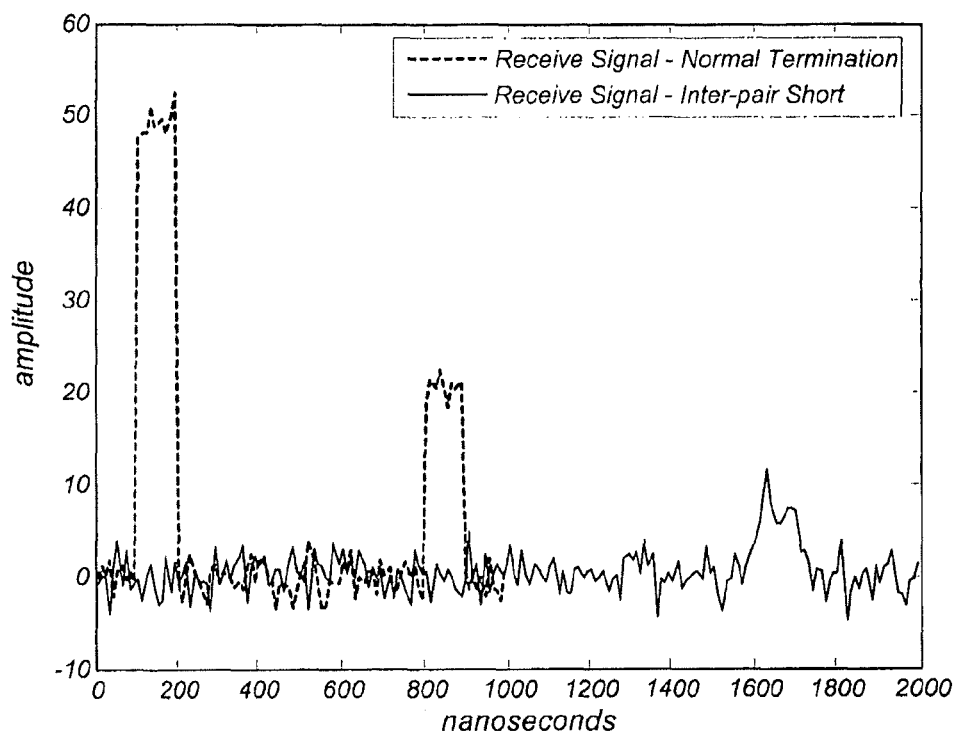
FIG. 6 illustrates an exemplary plot of comparison of cables with and without inter-pair shorts.

This method also calculates the cable length for a cable with a wire short that spans any of the four wire pairs ("inter-pair short"). The calculation has some minor differences from the previous case. In this case, the transmitted pulse reflection travels through the short to the termination of the other pair and then reflects back to the transmit pair so the length of travel is doubled. The extra distance combined with the short itself can cause a low-pass effect such that the one-point difference is not sufficient as a high-pass filter to identify the reflected pulse edges. Instead, a higher order high-pass filter may be applied that has a lower corner frequency, and the duration of the reflected pulse that needs to be past the threshold line is reduced. FIG. 6 illustrates an example plot of a comparison of cables with and without inter-pair shorts.

Cable Terminations

Figure 7:
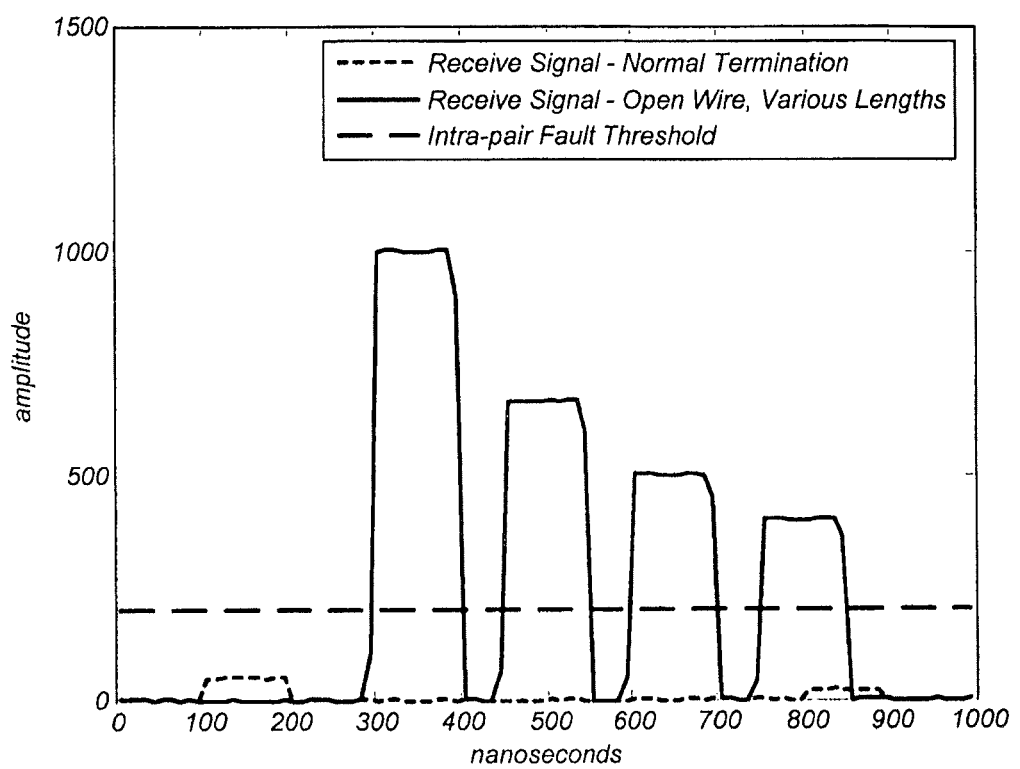
FIG. 7 illustrates an exemplary plot of superimposed plots of open terminations for various cable lengths.

In one variation the method may also indicate whether the cable under test is terminated correctly to another PHY, or whether the cable is faulty due to an open wire, a wire shorted across a single pair ("intra-pair short"), or a wire shorted across two different pairs ("inter-pair short"). The choice is determined by using the amplitude of the far end echo. For the case of intra-pair opens and shorts, in this embodiment the maximum absolute value of the unfiltered echo is compared to a fixed threshold. Other embodiments may use variable thresholds in proportion to the distance, and may use other amplitude measurements on the unfiltered echo or a filtered version of the echo. Other embodiments may also use a duration criterion to identify the echo. If the amplitude value exceeds the threshold, the polarity of the maximal value determines whether the cable fault is an intra-pair short or an open wire. Other embodiments may use a non-maximal value to determine the polarity of the far end echo. If the value is within the threshold, the cable is identified as good and connected to a far end PHY. FIG. 7 illustrates an exemplary plot of superimposed plots of open terminations for various cable lengths.

For the case of inter-pair shorts, the test is conducted by transmitting a pulse on one pair and analyzing the received samples on each of the other three pairs. The maximum absolute value on each of those receive pairs is checked against a fixed threshold, though other values and variable thresholds may be used. This threshold may be smaller than that of the intra-pair open/short case because any value that exceeds the noise floor indicates an inter-pair short cable fault.

Figure 8:
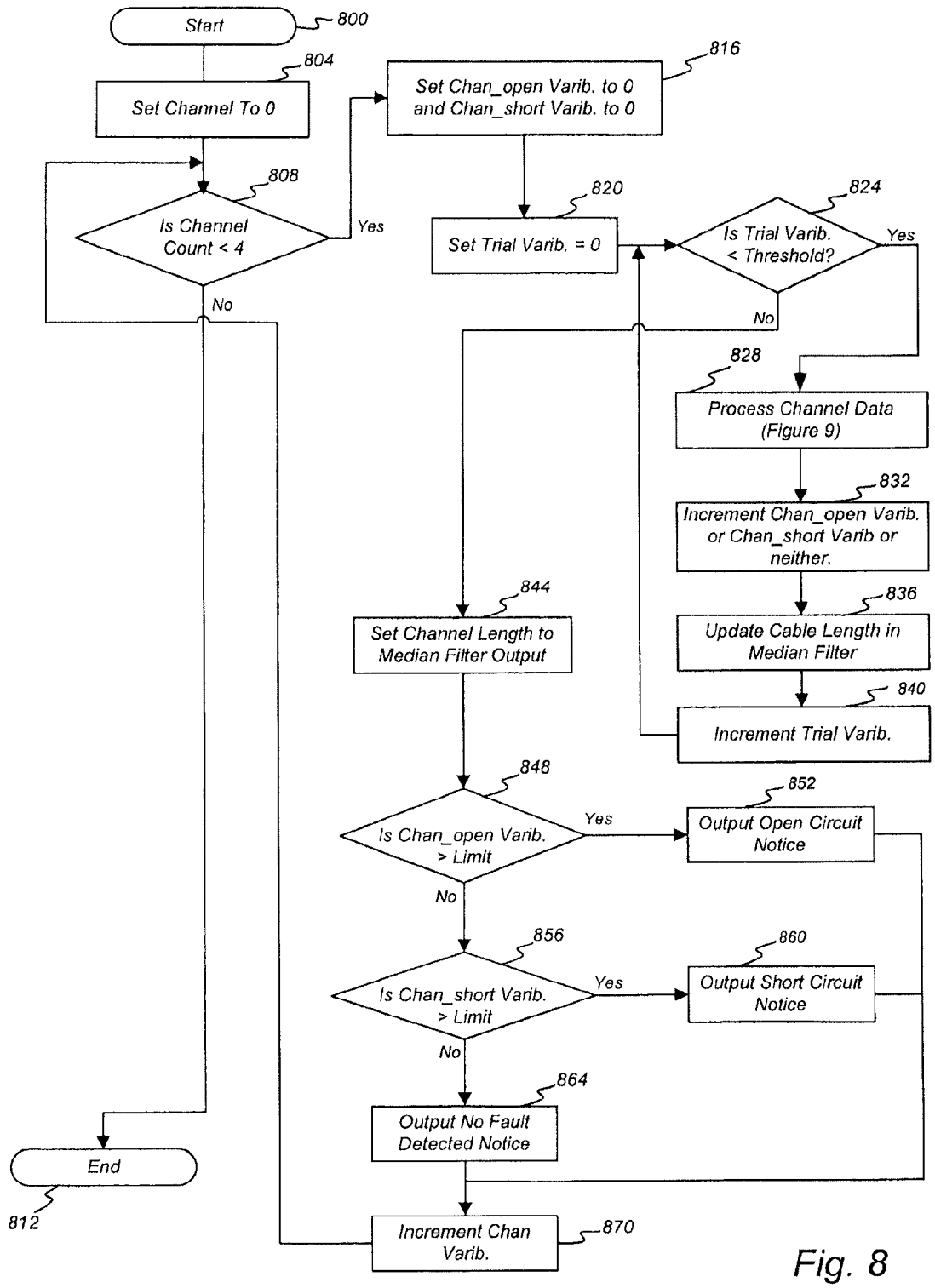
FIG. 8 illustrates an exemplary high level operational flow diagram of a method for cable analysis for a terminated cable having intrapair (within each pair) opens or shorts, or no faults within each pair.

FIG. 8 illustrates a high level operational flow diagram of a method for cable analysis for a cable terminated to another PHY or having intra-pair (within each pair) opens or shorts. This method achieves robust measurements and avoids interference from far end signals, such as auto-neg type signal. This is but one possible method of operation and as such it is possible that one of ordinary skill in the art may arrive at different methods of operation without departing from the claims that follow. At a step 800 the operation starts and initializes. Initialization may occur at a step 804 which sets the channel being processed to channel 0. It is contemplated that any number of channels may be part of the communication system, and in this embodiment 4 channels (0-3) are present.

Then, at a decision step 808 the operation determines if the channel count is less than four. Because this is a four channel embodiment, step 808 compares the channel count to four. If at decision step 808 the channel count is greater than or equal to four, the operation ends at step 812. Alternatively, if the channel count is less than 4, then the operation advances to step 816.

At step 816 the operation initializes the chan_open variable to zero and initializes the chan_short variable to zero. The chan_open variable comprises a value representing the number of times the routine results in a determination of an open circuit on the channel under analysis. The chan_short variable comprises a value representing the number of times the routine results in a determination of an open circuit on the channel under.

Next, at a step 820, the operation sets the trial variable to zero. The trial variable represents the number of times a pulse is transmitted and the corresponding received signal is analyzed. After setting the trial variable to zero, or other predetermined value, the operation advances to decision step 824. At decision step 824 the operation determines if the trial variable is less than a threshold variable. The threshold may comprise a limit on the number of times to repeat or execute the operation. In one embodiment the threshold value comprises 5 while in other embodiments the threshold value may comprise a different value. High threshold values yield more accurate results but demand more time to complete the routine.

If at decision step 824 the operation determines that the trial variable is less than the threshold, then the operation advances to a step 828. At step 828 the operation processes the channel data as is set forth in detail in FIG. 9 which follows. The processing of channel data comprises processing the reflected transmit pulse optionally in connection with other data. Thereafter, at a step 832 the operation may increment the chan_open variable or the chan_short variable based on the results of the processing at step 828.

At a step 836 the operation updates the cable length data. The cable length data comprises data regarding the length of the cable as determined by the time domain reflectometry routine of FIG. 9. Then at a step 840, the operation increments the trial variable to thereby designate the routine as having been run. The trial variable represents the number of times the routine has run and the threshold at step 824 represents the number of times the routines is set to run. Thereafter, the operation returns to decision step 824 and at this decision step the routine again evaluates whether the trial variable is less than the threshold. If not, then the operation advances to step 844.

At a step 844 the operation sets the channel length to the median filter output length and then advances to a decision step 848. At decision step 848, the operation determines if the chap open variable is greater than a predetermined limit. The limit may comprise any number but is related to the number of trials. In summary, if the chap open variable is greater than the limit then the operation outputs a notice, such as via a user interface, that an open circuit condition exists. This occurs at a step 852. As can be appreciated, the limit at which an open circuit is declared will depend on the number of trials. A larger limit value may be associated with a larger number of trials.

If at decision step 848 the operation determines that the chap open variable is not greater than the limit, the operation advances to decision step 856. At decision step 856 the operation determines if the chan_short variable is greater than the limit, A same or different limit value as used in step 848 may be used in step 856. If the chan_short variable is greater than the limit value then the operation advances to step 860 and the operation outputs a notice that the channel has a short circuit. Alternatively, if at decision step 856 the chan_short variable is not greater than the limit value, the operation advances to step 864 wherein the system outputs a notice that no fault is detected. After steps 852, 860, and 864 the operation advances to step 870 where the operation increments the chan variable, and thereafter returns to decision step 808, which is described above.

Figure 9:
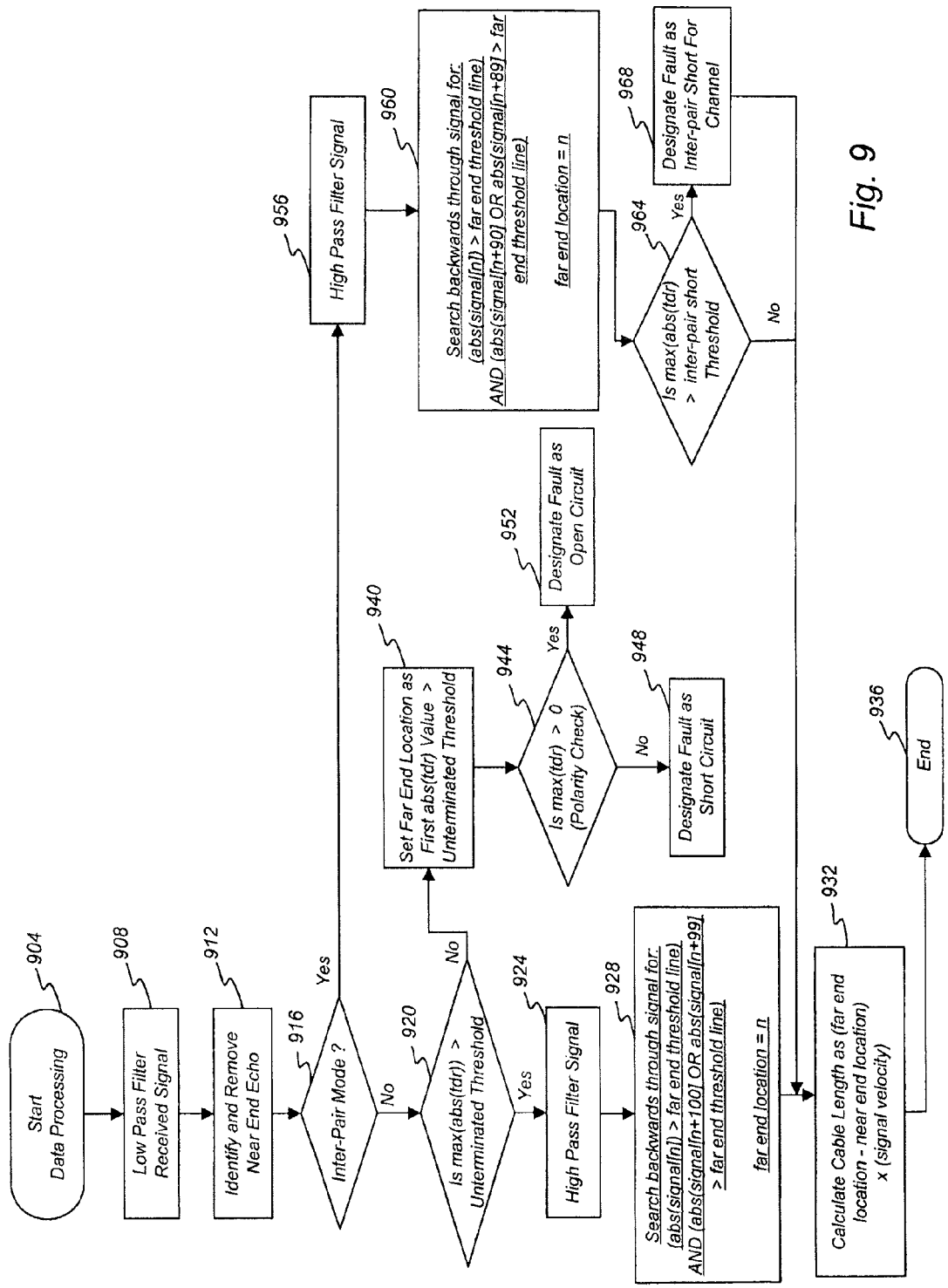
FIG. 9 illustrates an exemplary operational flow diagram of an example method of performing analysis of an echo signal to estimate the length of the cable to a far end PHY or to the distance to an intra-pair fault, if a fault is present.

FIG. 9 illustrates an exemplary operational flow diagram of an example method of performing analysis of an echo signal to estimate the length of the cable to the distance to a fault, if a fault is present. This is but one possible method of operation and as such it is possible that one of ordinary skill in the art may arrive at different methods of operation without departing from the claims that follow.

At a step 904, the operation begins the data processing routine on the reflected signal, which may be referred to as the time domain reflected signal. Thereafter, at a step 908, the operation low pass filters the received signal, and at a step 912 identifies and removes the near end echo. The removal of the near end echo may be done by setting the near end location as the first reflected value which is greater than the near end threshold. This accounts for reflection from the hybrid or other near end components or terminations. The near end threshold may be proportional to the noise level of the received signal.

Next, at a decision step 916 the operation determines whether the processing operation is for an inter-pair mode. Inter-pair mode comprises analysis of a signal between two or more pairs and is in contrast to intra-pair mode which comprises analysis for signals within a pair. If at decision step 916 the operation determines the processing is not for inter-pair mode or data, then the operation advances to step 920. At decision step 920, the operation determines if there is a fault on the cable by analyzing the maximum absolute value of the time domain reflection data (hereafter TDR) to determine if it is greater than the unterminated threshold. The unterminated threshold comprises a predetermined value that indicates a fault in the cable. The unterminated threshold may also be a set of values associated with the distance to the fault, and the threshold is often in proportion to the distance to the fault.

If at decision step 920 the maximum absolute value of the reflection is less than the unterminated threshold, then a no fault result is the outcome and the operation advances to step 924. A no fault result occurs because the TDR reflection indicated a channel which is terminated to another PHY or electrically equivalent device.

Next, at a step 924, high pass filtering occurs to improve the signal to noise ratio of high frequency content, such as pulse edges, which in turn improves detection of the far end echo. Then at a step 928, the operation processes the filtered TDR data to identify the location of the far end echo. The processing equation in step 928 of FIG. 9 is one exemplary operation that may occur, but other equations or routines are contemplated. In the operation of step 928 the system searches for reflections which match the shape and duration of an auto negotiation pulse. The variable n represents the start of the far end echo in nanoseconds of time, the value n+100 represents the time value plus one hundred nanoseconds, and the value n+99 represents the time value plus ninety-nine nanoseconds. In other embodiments, other values may be utilized. Stated another way, this represents a position in time plus a predetermined additional time period. This additional period may be a single value or a set of two or more values that span a time less than the duration of the transmitted pulse. In this embodiment the time period is approximated to the duration of a standard compliant AN pulse which is 100 nanoseconds, as well as one nanosecond less than this duration. This step may be considered as analyzing a range of values to locate the actual echo signal to distinguish it from noise.

Next, the operation advances to a step 932 to calculate the cable length. In this embodiment the cable length is determined by calculating the far end location minus the near end location and multiplying the result by the signal velocity within the cable. Thereafter the cable length is output or returned to the respective routine of FIG. 8 or FIG. 10. The operation ends at step 936 which may include return to another routine.

Alternatively, if at step 920 a determination is made that an intra-pair fault is present on the channel being analyzed, the operation advances to step 940. At step 940 the operation sets the far end location as the first absolute TDR data value that is greater than the unterminated threshold. The unterminated threshold is discussed in step 920. Next, the operation advances to step 944 and the operation determines if the maximum TDR data value is greater than zero. This serves as a polarity check. If the maximum TDR data value is greater than zero then the operation advances to step 952 at which the operation designates the fault as an open circuit. Thereafter the operation advances to step 932 and 936 as shown.

If at decision step 948 the polarity check reveals that the maximum TDR data value is less than zero, then at step 948 the operation designates the fault as a short circuit and then advances to step 932, 936.

Returning to step 916, if the processing is for identifying an inter-pair fault, then the operation advances to step 956 and high pass filtering of the TDR signal occurs. This filter provides the same benefit as in step 924. Next, at step 960, the operation processes the filtered TDR data to identify the location of the far end echo. The processing equation in step 960 of FIG. 9 may be similar to the processing of step 928. In one exemplary embodiment the equation shown in step 960 occurs, but other equations or routines are contemplated. In the operation of step 960 the system searches for reflections which match the shape and duration of an auto negotiation pulse. The variable n represents the start of the far end echo in nanoseconds of time, the value n+90 represents the time value plus ninety nanoseconds, and the value n+89 represents the time value plus eighty-nine nanoseconds. Stated another way, this represents a position in time plus a predetermined additional time period. This additional period may be a single value or a set of two or more values that span a time less than the duration of the transmitted pulse. In this embodiment the time period is approximated to slightly less than the duration of a standard compliant AN pulse which is 100 nanoseconds, as well as one nanosecond less than this duration. This step may be considered as analyzing a range of values to locate the actual echo signal to distinguish it from noise.

Next, at decision step 964 the operation performs a peak value analysis by determining if the maximum absolute value of the TDR signal is greater than the inter-pair short threshold. The inter-pair short threshold represents a value beyond which is an indicator of a short between two different pairs. If the peak value is greater than the threshold, then the operation advances to step 968 and the operation designates the fault as an inter-pair short for the particular channel. After step 964 and 968 the operation advances to steps 932 and 936.

Figure 10:
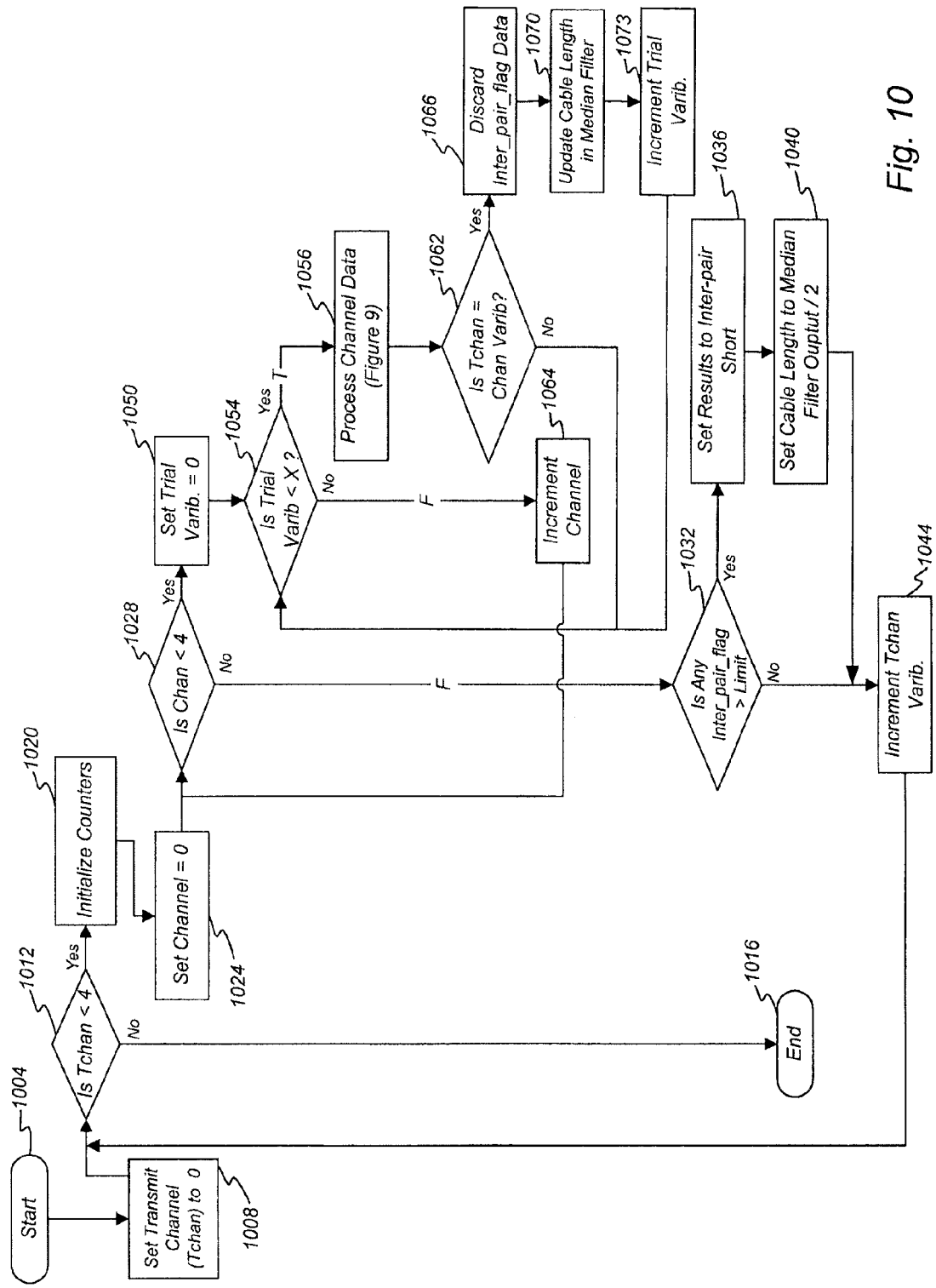
FIG. 10 illustrates an exemplary operational flow diagram of a method for cable analysis for detecting shorts between wire pairs, including between one or more wires on one pair and one or more wires on another pair including across pairs, and the distance to the short, if a short is present.

FIG. 10 illustrates an operational flow diagram of a method for cable analysis for detecting shorts between wire pairs, including between one or more wires on one pair and one or more wires on another pair including across pairs. This is but one possible method of operation and one of ordinary skill in the art may derive other methods of operation which do not depart from the claims that follow. In this embodiment, the operation starts at a step 1004. Next, at a step 1008 the operation sets the transmit channel to 0. In other embodiments, the operation could start with other channels. Then, at a decision step 1012, the operation determines if the transmit channel is less then four. In embodiments with other than 4 channels, a different comparison would occur. If not, then the operation ends and step 1016. In this method of operation a pulse is transmitted on one channel, and the received signal data on the other channels are monitored for the presence of a pulse. Because only one channel transmits at a given time, a pulse on the other channels during that time indicates a short between the channel transmitting the pulse, and a monitored channel.

If the transmit channel number is less than four, then the operation advances to step 1020 and the counters or variables are initialized. The counters or variables are set forth below. Then, at a step 1024, the operation sets the channel equal to zero as a starting point for the routine. In one embodiment this comprises initializing the receiver channel loop. At decision step 1028 the operation determines if the channel is less than four. As the routine loops through each channel analysis, the channel number is incremented. If the channel is less than four, the operation advances to step 1050 and sets the trial variable to zero. The trial variable represents the number of times the routine has executed. Each routine execution generates additional data which is used to populate the median filter and the majority rule data. In general, the routine is run multiple times to generate multiple sets of measurement data, each of which is analyzed. Through use of multiple sets of data, abnormal data may be discarded or ignored to thereby yield more consistent and accurate results.

Thereafter, at decision step 1054 the operation determines if the trial variable is less than a variable threshold X, where X can equal any number of times the loop routine is to execute. The larger the value of X the more accurate the results, but the longer the operation takes to complete. In one embodiment, the value of X is 5. If the result of decision step 1054 is true or yes, the operation advances to step 1056 and processing of channel data occurs. One example embodiment of channel data processing is set forth in FIG. 9.

The operation then advances to a decision step 1062 during which the operation determines if the transmit channel (tchan) is equal to the channel variable. If it is, then the operation ignores or discards any indication of an inter-pair short at step 1066 because the channel upon which the signal was transmitted is also the channel upon which the reflection was received. Therefore, it can not indicate a short that spans two channels as is the purpose of the routine. Next, at a step 1070, the operation adds the cable length to the median filter, and the operation increments the trial variable and returns to step 1054. If at step 1062 the transmit channel does not equal the channel variable value, then the operation returns to step 1054.

If at step 1054 the trial variable is not less than the value X, then the operation advances to step 1064 at which time the operation increments the channel value as part of the loop operation. The operation then returns to step 1028.

If after one or more loop routines, the channel value is not less than four or the number of channels in the system or under analysis, then the operation advances to decision step 1032. At decision step 1032 the operation determines if the inter-pair flag counter for any channel is greater than a predetermined limit. The limit may comprise any number and may be related to the number of trials, X. As can be appreciated, the limit at which an open circuit is declared will depend on X. A larger limit value may be associated with a larger X. If any inter-pair flag counter is greater than the limit, then the operation advances to step 1036, and the routine sets the results for the inter-pair operation to indicate a short. Then at step 1040 the operation sets the cable length to the median value output divided by two. Division occurs because the reflection traveled to the short, through the short, to another channel's termination and then back through the short to the originating channel for detection. Therefore, the distance to the short is only half of the distance traveled by the reflected pulse.

After step 1040 or if the result of decision step 1032 is no, then the operation advances to step 1044 at which time the operation increments the transmit channel variable and returns to decision step 1012 as shown.

While various embodiments of the invention have been described, it will be apparent to those of ordinary skill in the art that many more embodiments and implementations are possible that are within the scope of this invention. In addition, the various features, elements, and embodiments described herein may be claimed or combined in any combination or arrangement.

The invention claimed is:

1. A method, comprising:
   generating a pulse;
   transmitting the pulse on a first cable of a multi-cable communication system;
   monitoring the first cable to detect a first reflection of the pulse on the first cable, including using a first high-pass filter with a first corner frequency;
   determining whether the first cable is faulty based on an amplitude of the first reflection;

monitoring a second cable of the multi-cable communication system to detect whether the pulse or a second reflection of the pulse appears on the second cable of the multi-cable communication system, wherein detecting whether the pulse or the reflection of the pulse appears on the second cable includes using a second high-pass filter with a second corner frequency lower than the first corner frequency of the first high-pass filter; and responsive to the pulse or the second reflection of the pulse being detected to appear on the second cable of the multi-cable communication system, outputting a notification of a short between (i) the first cable of the multi-cable communication system and (ii) the second cable of the multi-cable communication system.

2. The method of claim 1, wherein responsive to the pulse or the second reflection of the pulse being detected to appear on the second cable of the multi-cable communication system, the method further comprises:

calculating a time duration between (i) transmitting the pulse on the first cable of the multi-cable communication system and (ii) receiving the pulse or the second reflection of the pulse on the second cable of the multi-cable communication system; and calculating a distance to the short based on the time duration and the speed of the pulse within the first cable of the multi-cable communication system.

3. The method of claim 2, further comprising:

calculating a time duration between transmitting the pulse on the first cable and receiving the first reflection on the first cable; and calculating a distance to the first cable end or the fault based on (i) the time duration between (a) transmitting the pulse on the first cable and (b) receiving the first reflection on the first cable, and (ii) a speed of the pulse within the first cable.

4. The method of claim 1, wherein the multi-cable communication system comprises and Ethernet communication system utilizing four twisted pair cables including the first cable and the second cable.

5. The method of claim 4, further comprising repeating monitoring and outputting for a third cable and a fourth cable in connection with detecting shorts between the first cable and each of the third cable and the fourth cable.

6. The method of claim 5, further comprising repeating the method for each cable in the four twisted pair cables.

7. The method of claim 1, wherein the pulse comprises a 100 nanosecond pulse.

8. An apparatus, comprising:

a transmitter configured to couple communicatively to a first cable of a multi-cable communication system;

a receiver configured to couple communicatively to the first cable and a second cable of the multi-cable communication system; and a processor configured to cause the transmitter to transmit a pulse on the first cable of the multi-cable communication system, monitor a first signal received via the first cable to detect a first reflection of the pulse on the first cable, including using a first high-pass filter with a first corner frequency, determine whether the first cable is faulty based on an amplitude of the first reflection, monitor a second signal received via the second cable to determine whether the pulse or a second reflection of the pulse is received by the receiver on the second cable of the multi-cable communication system, wherein determining whether the pulse or the reflection of the pulse is received by the receiver on the second cable includes using a second high-pass filter with a second corner frequency lower than the first corner frequency of the first high-pass filter, and responsive to the receiver receiving the pulse or the second reflection of the pulse on the second cable, output a notification of a short between (i) the first cable of the multi-cable communication system and (ii) the second cable of the multi-cable communication system.

9. The apparatus of claim 8, wherein, responsive to the receiver receiving the pulse or the second reflection of the pulse on the second cable, the processor is configured to:

calculate a time duration between (i) transmitting the pulse on the first cable of the multi-cable communication system and (ii) receiving the pulse or the second reflection of the pulse on the second cable of the multi-cable communication system, and calculate a distance to the short based on the time duration and the speed of the pulse within the first cable of the multi-cable communication system.

10. The apparatus of claim 9, wherein the processor is configured to:

calculate a time duration between transmitting the pulse on the first cable and receiving the reflection on the first cable; and calculate a distance to the first cable end or the fault based on (i) the time duration between (a) transmitting the pulse on the first cable and (b) receiving the first reflection on the first cable, and (ii) a speed of the pulse within the first cable.

11. The apparatus of claim 8, wherein the multi-cable communication system comprises and Ethernet communication system utilizing four twisted pair cables including the first cable and the second cable.

12. The apparatus of claim 11, further comprising a hybrid device, wherein:

the transmitter is configured to couple communicatively to the first cable, the second cable, a third cable, and a fourth cable via the hybrid device, the receiver is configured to couple communicatively to the first cable, the second cable, the third cable, and the fourth cable via the hybrid device, and the processor is configured to repeat monitoring and outputting for the third cable and the fourth cable in connection with detecting shorts between the first cable and each of the third cable and the fourth cable.

13. The apparatus of claim 12, the processor is configured to:

cause a respective pulse to be transmitted on each cable in the four twisted pair cables, and repeat for each cable in the four twisted pair cables monitoring and outputting.

14. The apparatus of claim 8, wherein the pulse comprises a 100 nanosecond pulse.

15. The apparatus of claim 8, wherein the processor comprises a digital signal processor.

16. The apparatus of claim 8, further comprising a memory device coupled to the processor;

wherein the processor is configured to execute machine readable instructions stored in the memory.

17. The apparatus of claim 8, further comprising a user interface coupled to the processor;

wherein the processor is configured to output the notification to the user interface.

* * * * *